United States Patent
Guo et al.

(10) Patent No.: US 8,500,962 B2
(45) Date of Patent: Aug. 6, 2013

(54) DEPOSITION SYSTEM AND METHODS HAVING IMPROVED MATERIAL UTILIZATION

(75) Inventors: George X. Guo, Palo Alto, CA (US); Kai-an Wang, Cupertino, CA (US)

(73) Assignee: Ascentool Inc, Palo Alto, CA (US)

( * ) Notice: Subject to any disclaimer, the term of this patent is extended or adjusted under 35 U.S.C. 154(b) by 118 days.

(21) Appl. No.: 13/160,511

(22) Filed: Jun. 15, 2011

(65) Prior Publication Data

US 2011/0240461 A1 Oct. 6, 2011

Related U.S. Application Data

(63) Continuation-in-part of application No. 12/176,411, filed on Jul. 21, 2008.

(51) Int. Cl.
| | |
|---|---|
| *C23C 14/00* | (2006.01) |
| *C23C 14/32* | (2006.01) |
| *C25B 9/00* | (2006.01) |
| *C25B 11/00* | (2006.01) |
| *C25B 13/00* | (2006.01) |

(52) U.S. Cl.
USPC ............ 204/192.12; 204/192.13; 204/298.19; 204/298.2

(58) Field of Classification Search
USPC ................ 204/192.12, 298.19, 298.2, 192.13
See application file for complete search history.

(56) References Cited

U.S. PATENT DOCUMENTS

| | | | |
|---|---|---|---|
| 5,047,130 A | 9/1991 | Akao | |
| 5,333,726 A | 8/1994 | Makowiecki | |
| 5,374,343 A | 12/1994 | Sasaki | |
| 5,565,071 A * | 10/1996 | Demaray et al. | 204/192.12 |
| 5,747,119 A | 5/1998 | Hirata | |
| 5,755,938 A | 5/1998 | Fukui | |
| 5,833,815 A * | 11/1998 | Kim et al. | 204/192.12 |
| 5,855,744 A * | 1/1999 | Halsey et al. | 204/192.12 |
| 5,873,989 A * | 2/1999 | Hughes et al. | 204/298.2 |
| 5,953,827 A | 9/1999 | Or | |
| 5,985,115 A | 11/1999 | Hartsough | |
| 6,080,287 A | 6/2000 | Drewery | |
| 6,113,752 A | 9/2000 | Hollstein | |
| 6,207,026 B1 | 3/2001 | Crocker | |
| 6,221,217 B1 | 4/2001 | Moslehi | |

(Continued)

FOREIGN PATENT DOCUMENTS

| | | | |
|---|---|---|---|
| JP | 02305961 A | * | 12/1990 |
| JP | 09059772 A | * | 3/1997 |
| JP | 10088339 A | * | 4/1998 |
| JP | 11323546 A | * | 11/1999 |

*Primary Examiner* — Michael Band
(74) *Attorney, Agent, or Firm* — SV Patent Service

(57) ABSTRACT

A method for substrate processing includes producing a magnetic field by a magnetron across the full width of a sputtering surface of a target in a first direction. The magnetron can produce two erosion grooves separated by a distance S on the sputtering surface. The method includes moving the magnetron continuously at a first speed by the distance S in a first segment along a linear travel path. The linear travel path is along a second direction perpendicular to the first direction. The method includes continuously sputtering a material off the sputtering surface and depositing the material on the substrate during the first segment, and moving the magnetron by the distance S in a second segment along the linear travel path at a second speed higher than the first speed without sputtering the material off the sputtering surface or sputtering materials off at significant lower rate.

8 Claims, 22 Drawing Sheets

U.S. PATENT DOCUMENTS

| | | |
|---|---|---|
| 6,235,634 B1 | 5/2001 | White |
| 6,238,532 B1 | 5/2001 | Rossnagel |
| 6,413,380 B1 | 7/2002 | Pinarbasi |
| 6,416,639 B1 * | 7/2002 | De Bosscher et al. ..... 204/298.2 |
| 6,454,920 B1 | 9/2002 | Haag |
| 6,641,701 B1 | 11/2003 | Tepman |
| 6,692,618 B2 | 2/2004 | Dubs |
| 6,723,210 B2 * | 4/2004 | Teng et al. ............... 204/192.22 |
| 6,730,194 B2 | 5/2004 | Schertler |
| 6,740,585 B2 | 5/2004 | Yoon |
| 6,758,948 B2 | 7/2004 | Johnson |
| 6,827,826 B2 * | 12/2004 | Demaray et al. ......... 204/192.15 |
| 2005/0145478 A1 | 7/2005 | Tepman |

* cited by examiner

DEPOSITION SYSTEM AND METHODS HAVING IMPROVED MATERIAL UTILIZATION

The present application is a Continuation-in-Part Patent Application of and claims priority to commonly assigned pending U.S. patent application Ser. No. 12/176,411, entitled "Deposition system having improved material utilization", filed by the same inventors on Jul. 21, 2008, the disclosure of which is incorporated by reference herein.

TECHNICAL FIELD

This application relates to an apparatus for depositing material on a substrate.

BACKGROUND OF THE INVENTION

Material deposition is widely used in window glass coating, flat panel display manufacturing, coating on flexible films (such as webs), hard disk coating, industrial surface coating, semiconductor wafer processing, photovoltaic panels, and other applications. Materials are sputtered or vaporized from a target source and deposited on a substrate. Conventional deposition systems have various drawbacks in material utilization. For example, referring to FIGS. 1A-1E, a deposition system 100 includes a rectangular target 110 above a substrate 115 in a vacuum chamber 120. A stationary magnetron 130 is held above the target 110. The substrate 115 can be transported in a direction 150 relative to the target 110 and the magnetron 130 to allow uniform deposition on the top surface of the substrate 115. A power supply 140 can produce an electric bias between the target 110 and walls of the vacuum chamber 120.

The magnetron 130 (FIG. 1C) includes a magnetic pole 132 of a first polarity and a magnetic pole 135 of a second polarity opposite to the first polarity. The magnetron 130 can produce magnetic flux outside of the sputtering surface 112 on the lower side of the target 110 (as shown in FIG. 1B) to confine plasma gas near the sputtering surface 112. More electrons can be confined near locations where the magnetic field parallel to the sputtering surface 112 and where the magnetic field is the strongest. A closed loop can be formed to trap the electrons by locations having local-maximum magnetic field strength. The closed path can guide the migration path for the trapped electrons near the sputtering surface 112. The closed-loop magnetic field can enhance the ionization efficiency of the sputtering gas (i.e. the plasma) to more effectively confine electrons near the sputtering surface 112. The enhanced ionization can allow lower operating pressure during sputter deposition, which is easier to implement in operation.

A drawback of the deposition system 100 is that it has low target material utilization. After a period of sputtering operations, as shown in FIGS. 1D and 1E, a non-uniform erosion pattern 115 usually appears on the sputtering surface 112 after a period of sputtering operations. The erosion pattern 115 typically includes a close-looped groove that matches the magnetic field strength of the magnetron 130. The most erosion occurs at target locations 116 that correspond to locations having high magnetic field strength where the sputtering gas is enhanced the most. The target 110 has to be replaced before the target locations 116 reach the top surface of the target 110. The target 110 is discarded and the unused target material 117 is wasted.

There is therefore a need to increase the utilization of target materials and to minimize waste in material depositions.

SUMMARY OF THE INVENTION

In one aspect, the present invention relates to a substrate processing system including a processing chamber that can house a substrate therein; a target comprises a sputtering surface in the processing chamber, wherein the substrate can receive material sputtered off the sputtering surface; a magnetron positioned adjacent to the target, wherein the magnetron can produce two erosion grooves separated by a distance S on the sputtering surface, wherein at least one of the two erosion grooves is characterized by an erosion width W; and a first transport mechanism that can move the magnetron in N steps along a travel path in a first direction, wherein N is an integer, wherein the magnetron can stop at each of the N steps to allow materials to be sputtered off the sputtering surface and to be deposited on the substrate, wherein the N steps have substantially the same step size, wherein the step size is approximately equal to the erosion width W.

In another aspect, the present invention relates to a substrate processing system including a processing chamber that can house a substrate therein; and a plurality of deposition sources, each comprising a target comprises a sputtering surface in the processing chamber, wherein the substrate can receive material sputtered off the sputtering surface; a magnetron positioned adjacent to the target, wherein the magnetron can produce two erosion grooves separated by a distance S on the sputtering surface, wherein at least one of the two erosion grooves is characterized by an erosion width W; and a first transport mechanism that can move the magnetron in N steps along a travel path in a first direction, wherein N is an integer, wherein the magnetron can stop at each of the N steps to allow materials to be sputtered off the sputtering surface and to be deposited on the substrate, wherein the N steps have substantially the same step size, wherein the step size is approximately equal to the erosion width W. The substrate processing system also includes a second transport mechanism that can move the substrate relative to the targets in the plurality of deposition sources.

In another aspect, the present invention relates to a method for substrate processing. The method includes placing a substrate a processing chamber; mounting a sputtering surface of a target in the processing chamber, placing a magnetron adjacent to the target; sputtering material off the sputtering surface to deposit on the substrate; producing two erosion grooves separated by a distance S on the sputtering surface, wherein one of the two erosion grooves is characterized by an erosion width W; moving the magnetron along a travel path in a first direction by a step size approximately equal to the erosion width W; and after the step of moving the magnetron, sputtering additional material off the sputtering surface to deposit on the substrate.

Implementations of the system may include one or more of the following. The ratio S/W can in a range of about N−0.1 and N+0.1. The step size is in a range of about 0.9 W and about 1.1 W. Both the two erosion grooves can be characterized by the erosion width W. The erosion width W can be defined by a distance between half-full-depths in the one of the two erosion grooves. Each of the two erosion grooves can include at least a segment substantially perpendicular to the first direction. The magnetron can produce a closed-loop erosion pattern in the sputtering surface after a period of material deposition, wherein the close-loop erosion pattern comprises two substantially parallel erosion grooves separated by the distance S. The two substantially parallel erosion grooves are aligned substantially perpendicular to the first direction. The substrate processing system can further include a second transport mechanism that can move the substrate relative to the target. The sputtering surface can be positioned to face the substrate in the processing chamber. The magnetron can be positioned adjacent to a back surface of the target opposite to the sputtering surface. The substrate processing system can further include a power supply that can produce a bias voltage between the target and the processing chamber. The substrate processing system can further include a shunting device that can reduce the amount of deposition when the magnetron is positioned at a step at the end of the travel path. The first transport mechanism can move the magnetron along a travel path after the N steps by approximately MS, wherein M is an integer.

In another general aspect, the present invention relates to a substrate processing system which includes a processing chamber that can house a substrate therein; a target that includes a sputtering surface in the processing chamber, wherein the substrate can receive material sputtered off the sputtering surface; a magnetron positioned adjacent to the target, wherein the magnetron can produce two erosion grooves separated by a distance S on the sputtering surface, wherein the magnetron can produce a magnetic field across the full width of the sputtering surface of the target in a first direction; and a first transport mechanism that can move the magnetron continuously at a first speed by the distance S in a first segment in a second direction perpendicular to the first direction, wherein the material is continuously sputtered off the sputtering surface and deposited on the substrate during the first segment, wherein the first transport mechanism can move the magnetron at a second speed higher than the first speed by the distance S in a second segment.

Implementations of the system may include one or more of the following. The first transport mechanism can move the magnetron in the same second direction in the first segment and the second segment, wherein the first transport mechanism can move the magnetron at the first speed by the distance S in a third segment while the material is continuously sputtered off the sputtering surface and deposited on the substrate during the third segment. The first transport mechanism can move the magnetron opposite to the second direction by the distance S in the second segment. The material is not sputtered off the sputtering surface in the second segment, or sputtered off the sputtering surface at a significant lower sputtering rate in the second segment than that in the first segment. The magnetron can be moved along a linear travel path along the second direction. The two erosion grooves can be substantially parallel to the first direction. The substrate processing system can further include a second transport mechanism that can move the substrate relative to the target. The magnetron can be positioned adjacent to a back surface of the target opposite to the sputtering surface. The substrate processing system can further include a power supply that can produce a bias voltage between the target and the processing chamber.

In another general aspect, the present invention relates to a method for substrate processing. The method includes: in a processing chamber, producing a magnetic field by a magnetron across the full width of a sputtering surface of a target in a first direction, wherein the magnetron can produce two erosion grooves separated by a distance S on the sputtering surface; moving the magnetron continuously at a first speed by the distance S in a first segment along a linear travel path, wherein the linear travel path is along a second direction perpendicular to the first direction; continuously sputtering a material off the sputtering surface and depositing the material on the substrate during the first segment; and moving the magnetron by the distance S in a second segment along the linear travel path at a second speed higher than the first speed.

Implementations of the system may include one or more of the following. The method can further include: moving the magnetron by the distance S in a third segment along the linear travel path; continuously sputtering the material off the sputtering surface; and depositing the material on the substrate during the third segment. The magnetron can be moved at the second speed by the distance S opposite to the second direction in the second segment. The material is not sputtered off the sputtering surface in the second segment, or sputtered off the sputtering surface at a significant lower sputtering rate in the second segment than that in the first segment. The method can further include producing a bias voltage between the target and the processing chamber to enable the material to be sputtered off the sputtering surface. The magnetron can be positioned adjacent to a back surface of the target opposite to the sputtering surface.

In another general aspect, the present invention relates to a method for substrate processing that includes in a processing chamber, producing a magnetic field by a magnetron across the full width of a sputtering surface of a target in a first direction, wherein the magnetron can produce two erosion grooves separated by a distance S on the sputtering surface; moving the magnetron continuously by the distance S in a first segment along a linear travel path along a second direction perpendicular to the first direction; continuously sputtering a material off the sputtering surface and depositing the material on the substrate during the first segment; moving the magnetron by a distance S in a second segment along the linear travel path opposite to the second direction; and continuously sputtering a material off the sputtering surface and depositing the material on the substrate during the second segment.

Embodiments may include one or more of the following advantages. Embodiments may include one or more of the following advantages. The described deposition systems and methods can improve the usage efficiency of target material and can therefore reduce target cost and reduce work for the target replacement. The described target arrangements and methods are applicable to different target and magnetron configurations.

The details of one or more embodiments are set forth in the accompanying drawings and in the description below. Other features, objects, and advantages of the invention will become apparent from the description and drawings, and from the claims.

DETAILED DESCRIPTION OF THE INVENTION

Figure 1A:
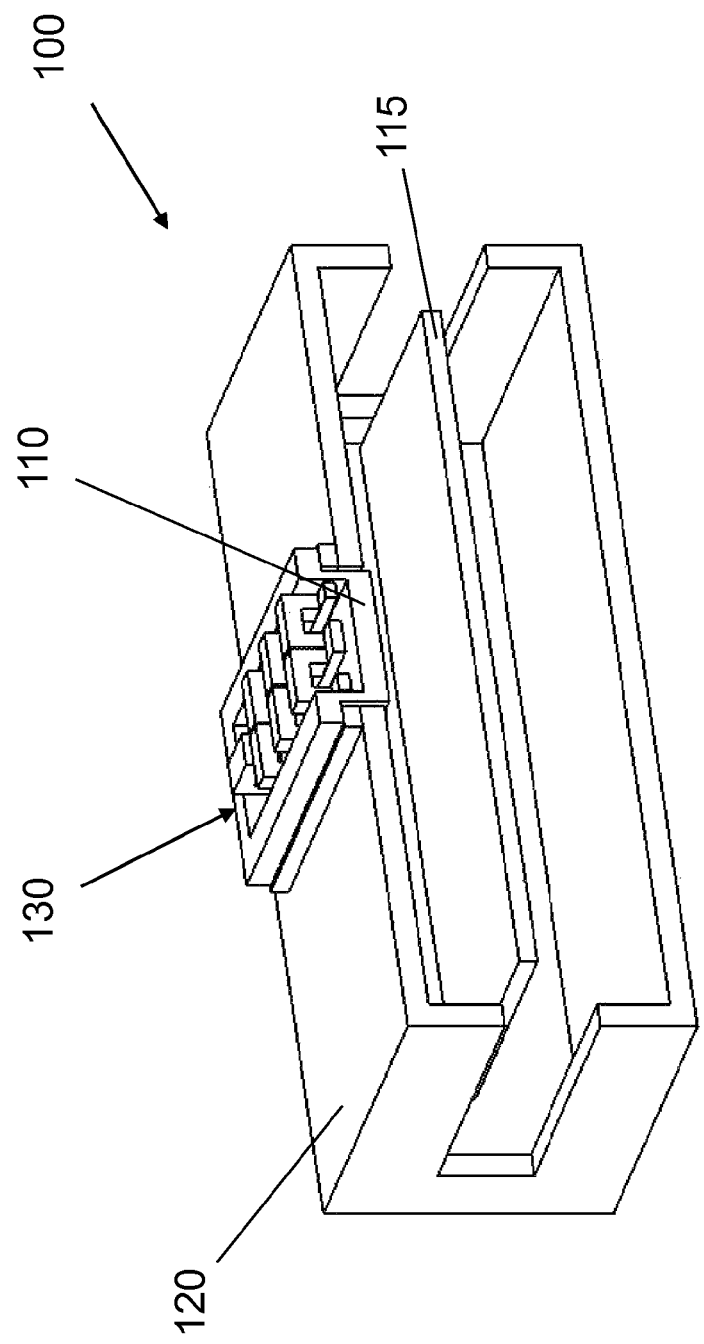
FIG. 1A is a perspective view of a conventional deposition system.
Figure 1B:
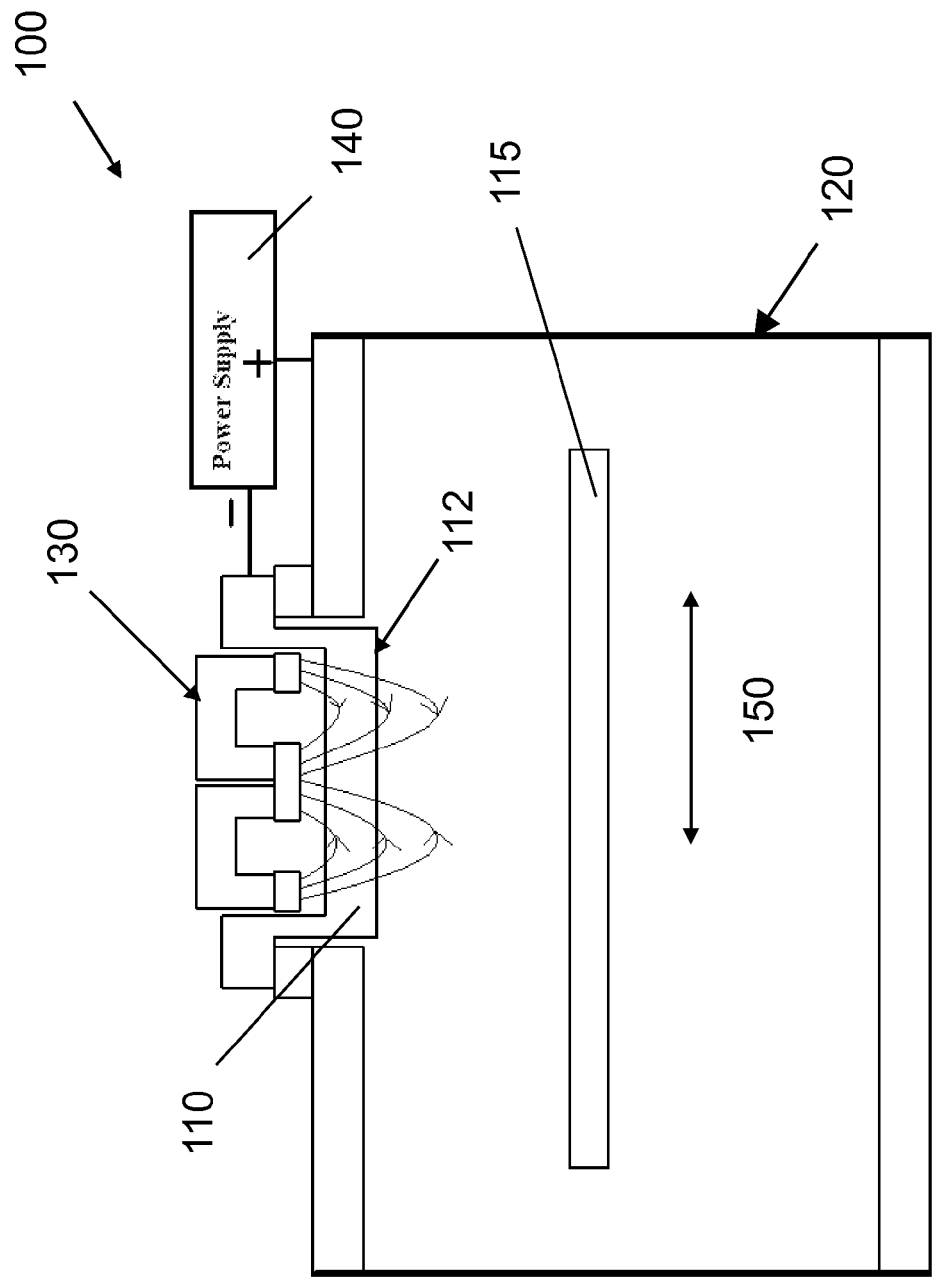
FIG. 1B is a cross-sectional view of the conventional deposition system of FIG. 1A.
Figure 1C:
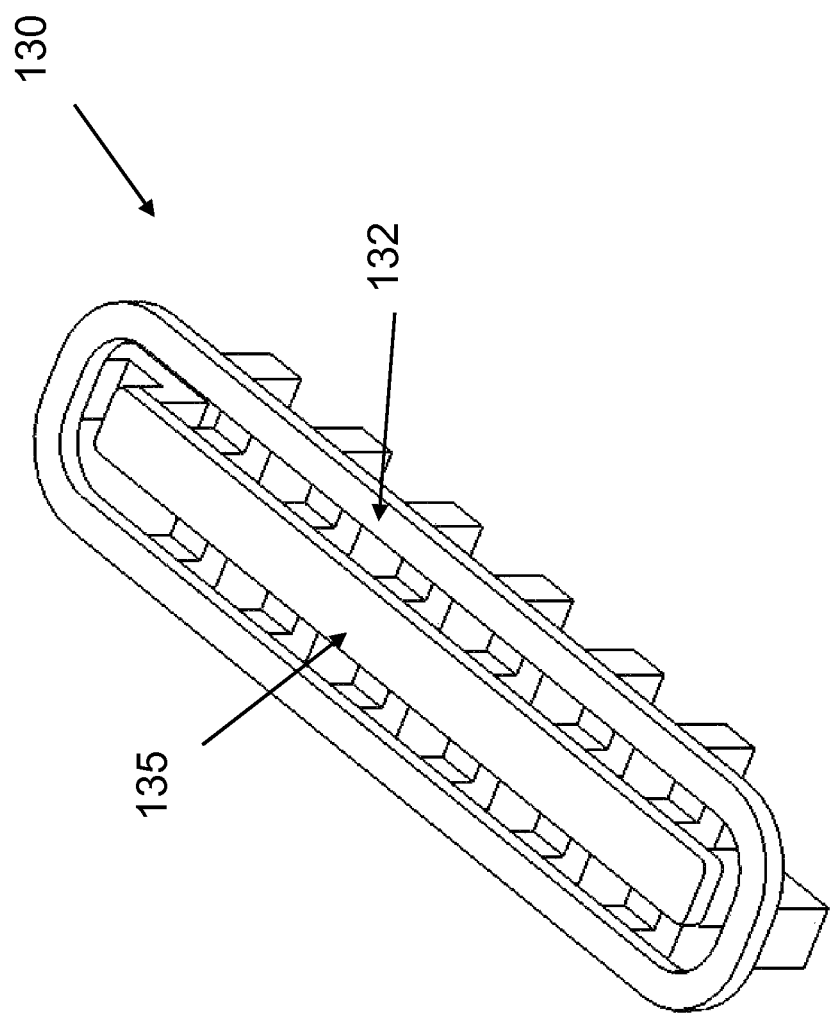
FIG. 1C is a bottom perspective view of the magnetron in the conventional deposition system of FIG. 1A.
Figure 1D:
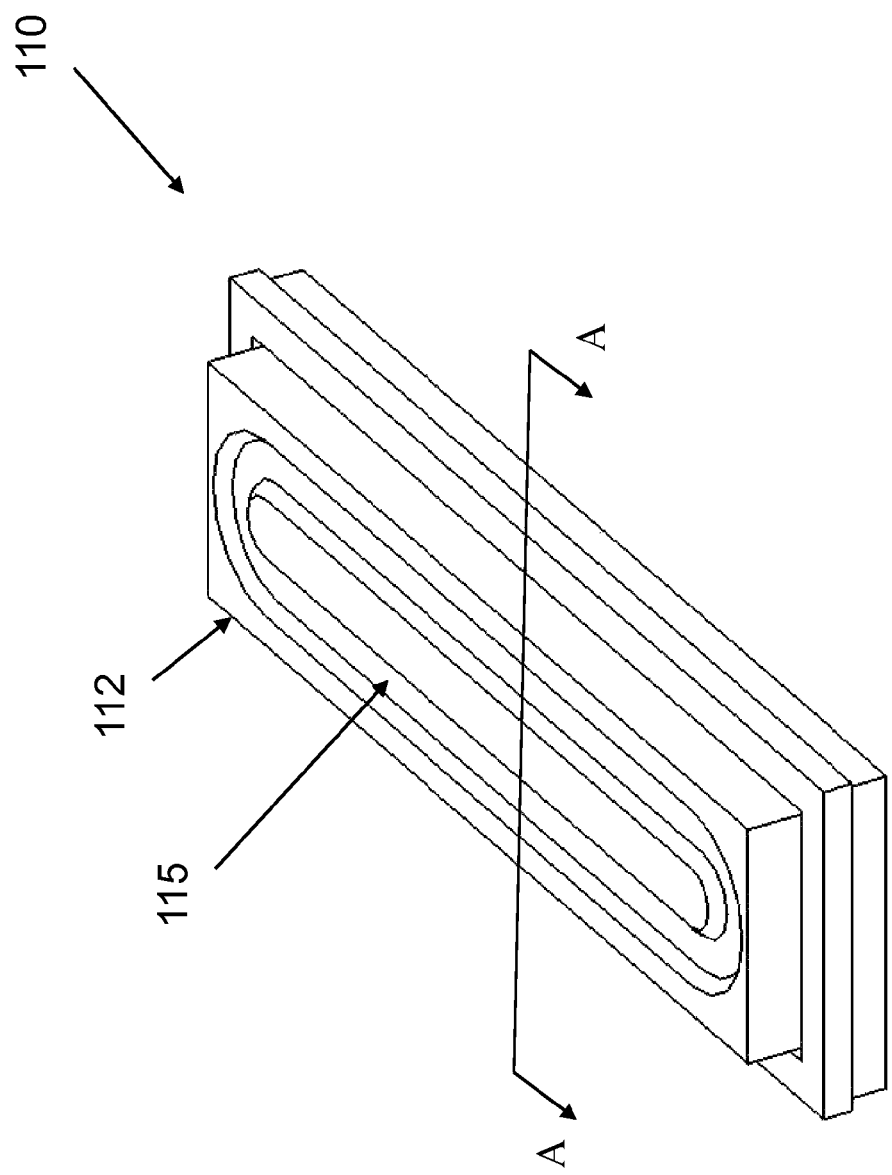
FIG. 1D is a perspective view of the target in the conventional deposition system of FIG. 1A showing an erosion pattern on the target's sputtering surface.
Figure 1E:
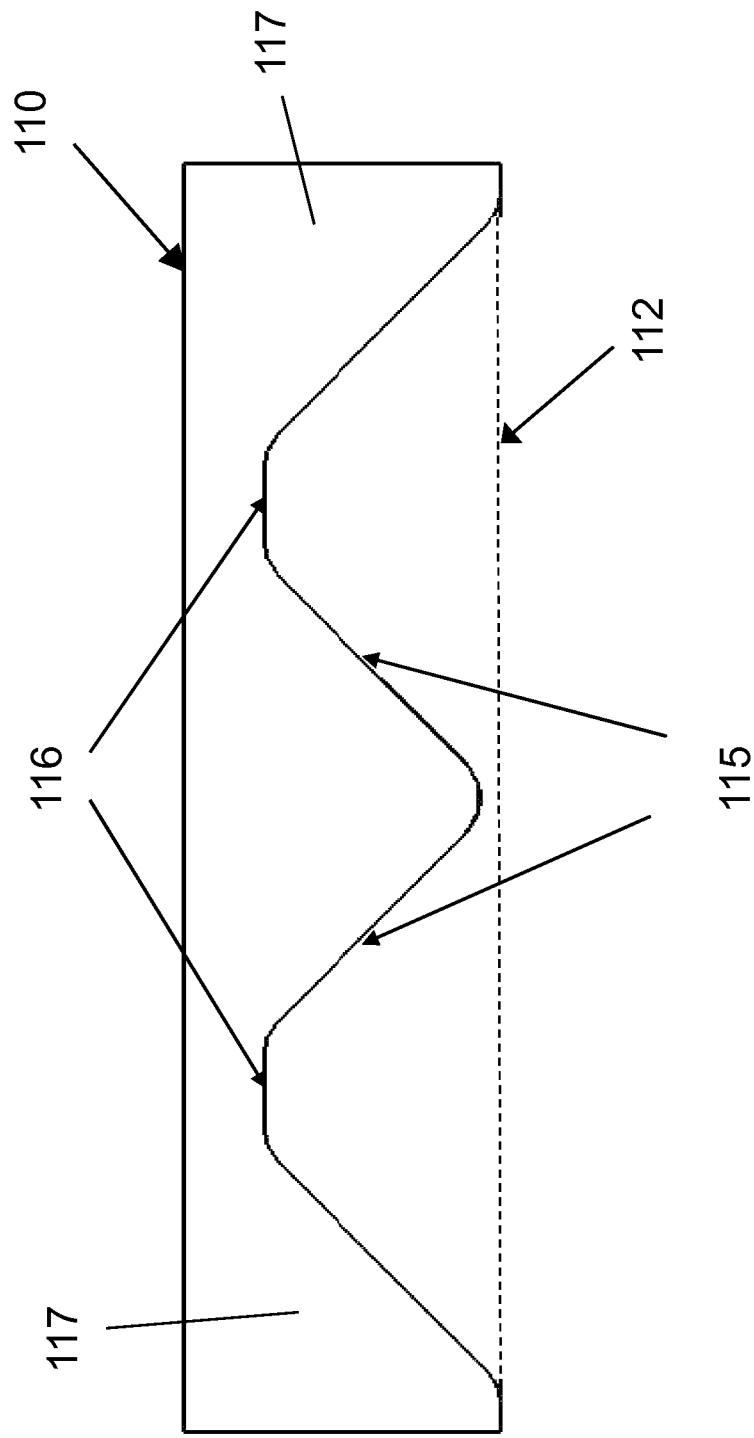
FIG. 1E is a cross-sectional view of the target along line A-A FIG. 1D showing an erosion pattern.
Figure 2A:
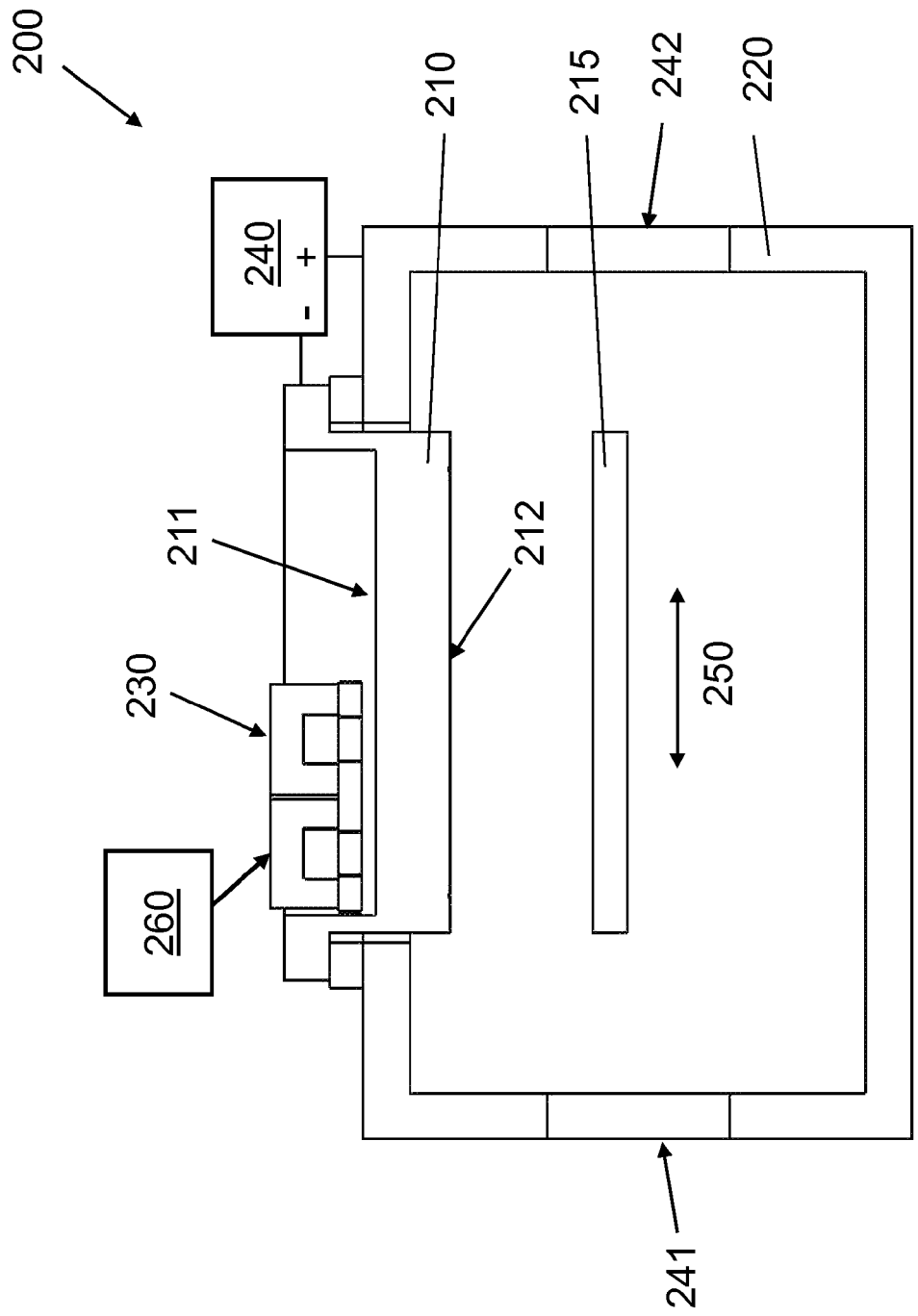
FIG. 2A is a cross-sectional view of a deposition system in accordance with the present invention.
Figure 2B:
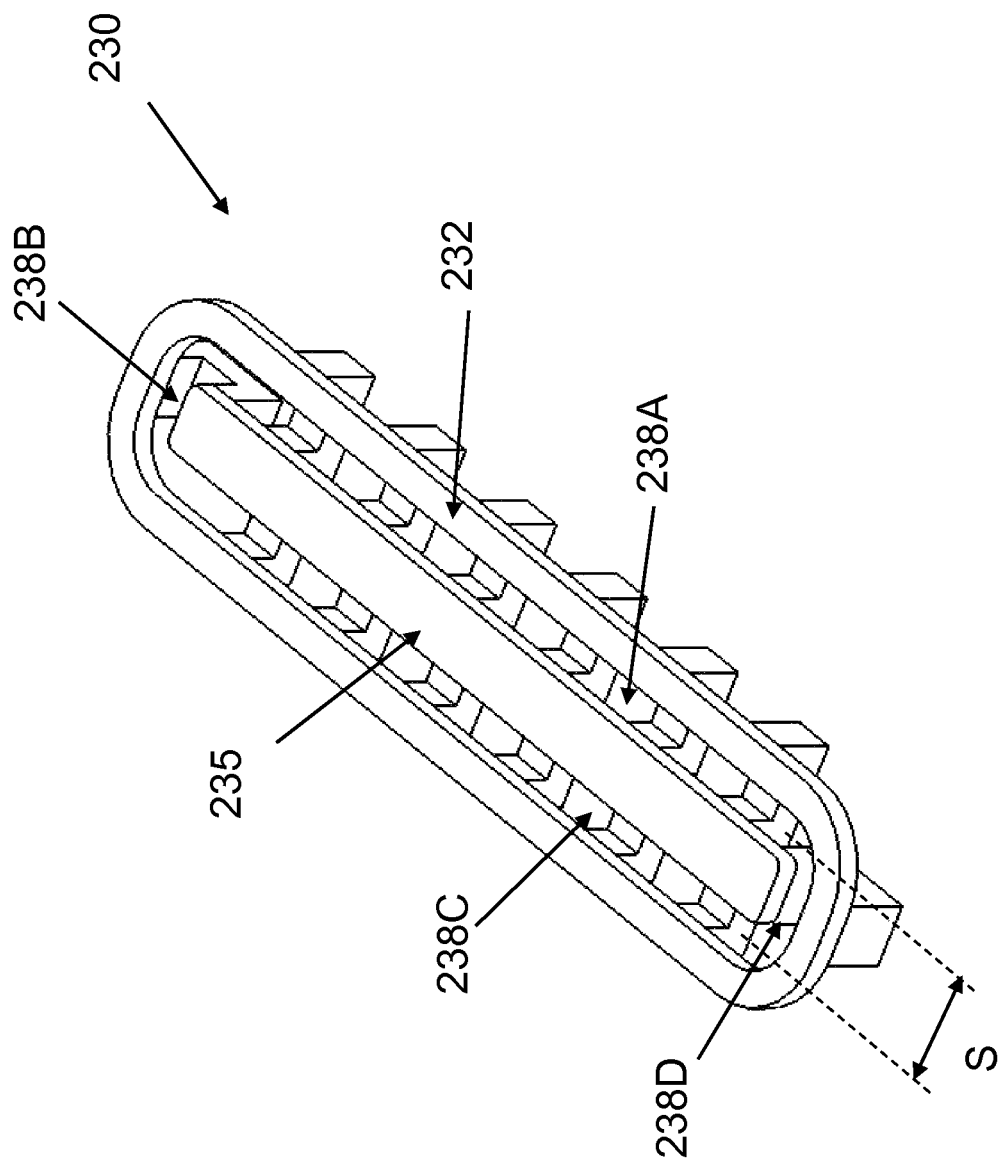
FIG. 2B is a bottom perspective view of the magnetron in the deposition system of FIG. 2A.
Figure 2C:
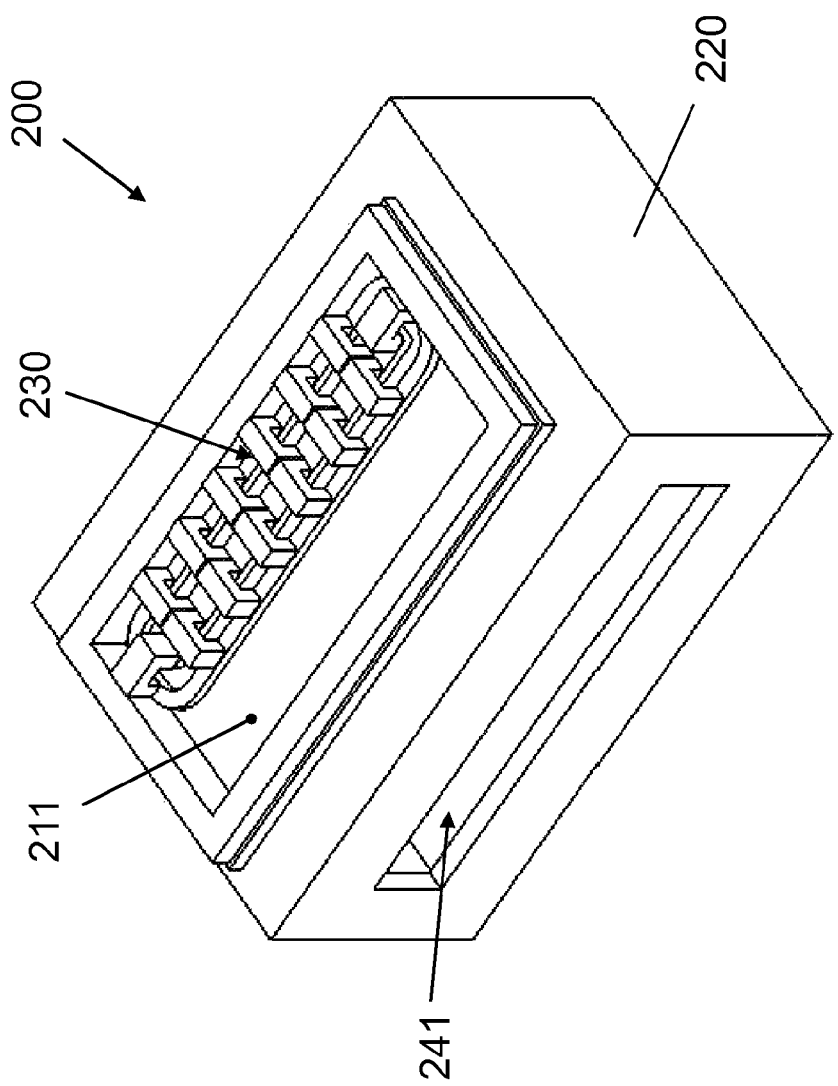
FIG. 2C is a perspective view of the deposition system in FIG. 2A.
Figure 2D:
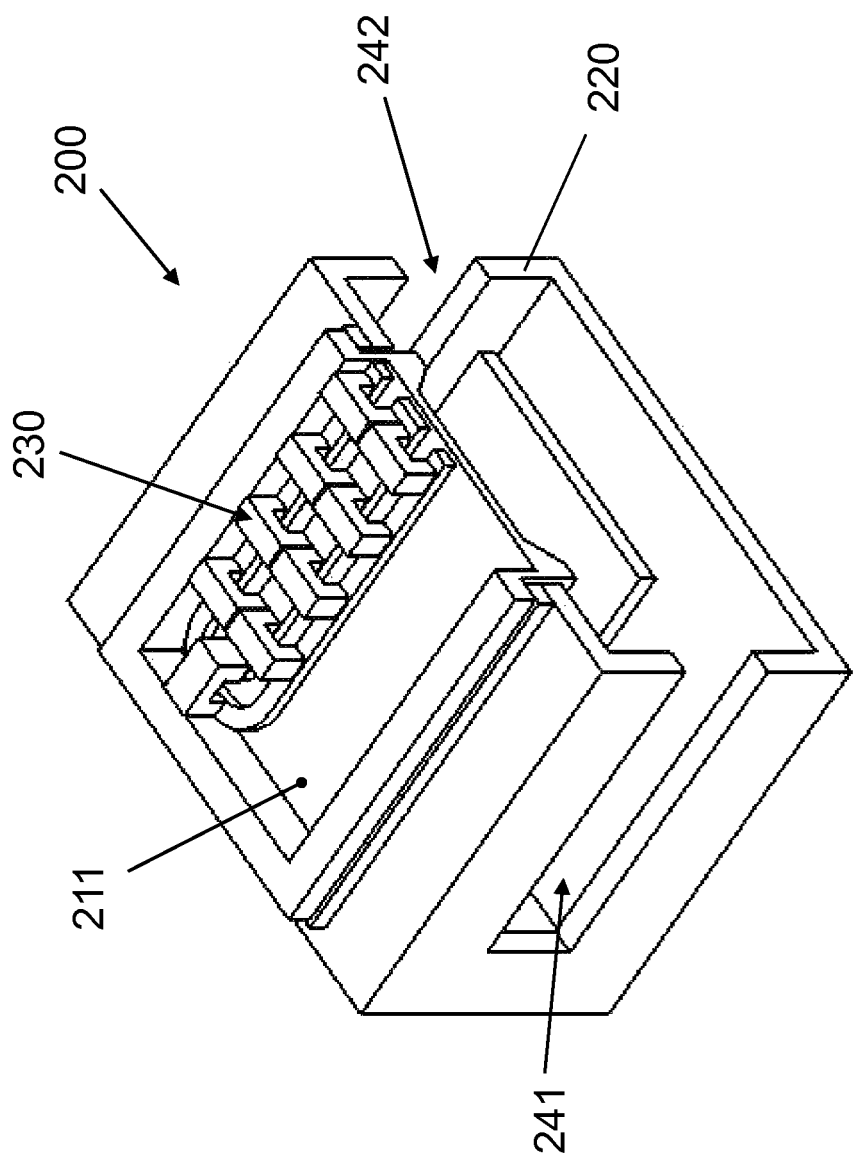
FIG. 2D is a cross-sectional perspective view of the deposition system of FIG. 2A.

Referring to FIGS. 2A-2C, a deposition system 200 includes in a processing chamber 220 having openings 241 and 242. Doors (not shown) can seal the openings 241 and 242 to keep the processing chamber 220 in a vacuum environment. A substrate 215 can be moved by a transport mechanism in a direction 250. The substrate 215 can be moved into and out of the processing chamber 220 through the openings 241 and 242. A target 210 is positioned above the substrate 215. The target 210 includes a back surface 211 and a sputtering surface 212 facing the substrate 215. The sputtering surface 212 is positioned in the processing chamber 220. The processing chamber 220 is exhausted to a vacuum environment for deposition. During deposition, target material is sputtered off the sputtering surface 212 in a vacuum environment and is deposited on the substrate 215.

A moveable magnetron 230 is positioned adjacent to the back surface 211 of the target 210. The magnetron 230 can be moved across the back surface 211 by a transport mechanism 260. The relative movement between to the target 210 and the substrate 215 allows uniform deposition of the target material on the substrate 215. A power supply 240 can produce an electric bias between the target 210 and walls of the processing chamber 220. The electric bias can be in the form of DC, AC, or RF voltages and can induce plasma gas in the processing chamber 220. The ions in the plasma are attracted to the target 210 and can sputter off target material from the sputtering surface 212. The magnetron 230 can increase ionization efficiency of the plasma by trapping excited electrons near the sputtering surface 212 by Lorentz force. The magnetron 230 can beneficially reduce deposition pressure and allows lower electric bias voltage between the target 210 and the walls of the processing chamber 220. Details about deposition systems are also disclosed in the commonly assigned pending U.S. patent application Ser. No. 11/847,956 (ASC009), tilted "Substrate processing system having improved substrate transport", filed Aug. 30, 2007, the content of which is incorporated herein by reference.

Referring to FIG. 2B, the magnetron 230 includes magnetic poles 232 and 235 of opposite polarities and separated by gaps 238A-238D which form a closed loop between the magnetic poles 232 and 235. The two long gaps 238A and 238C are separated by a distance "S". The magnetron 230 can produce magnetic flux between the magnetic poles 232 and 235. The magnetic flux lines near the sputtering surface 212 to confine the plasma gas near the sputtering surface 212. The magnetic field confinement of electrons is the strongest when the magnetic field is parallel to the sputtering surface 212. More electrons thus tend to be confined at locations wherein the magnetic field is parallel to the sputtering surface 212. The locations of local-maximum magnetic field strength by the magnetron 230 can form a closed loop adjacent to the gaps 238A-238D, which traps the most electrons in the plasma gas. The closed loop can guide the movement of the trapped electrons and extend their stay near the sputtering surface 212. The closed-loop magnetic field can enhance ionization efficiency of the plasma to more effectively confine electrons near the sputtering surface 212.

Figure 3A:
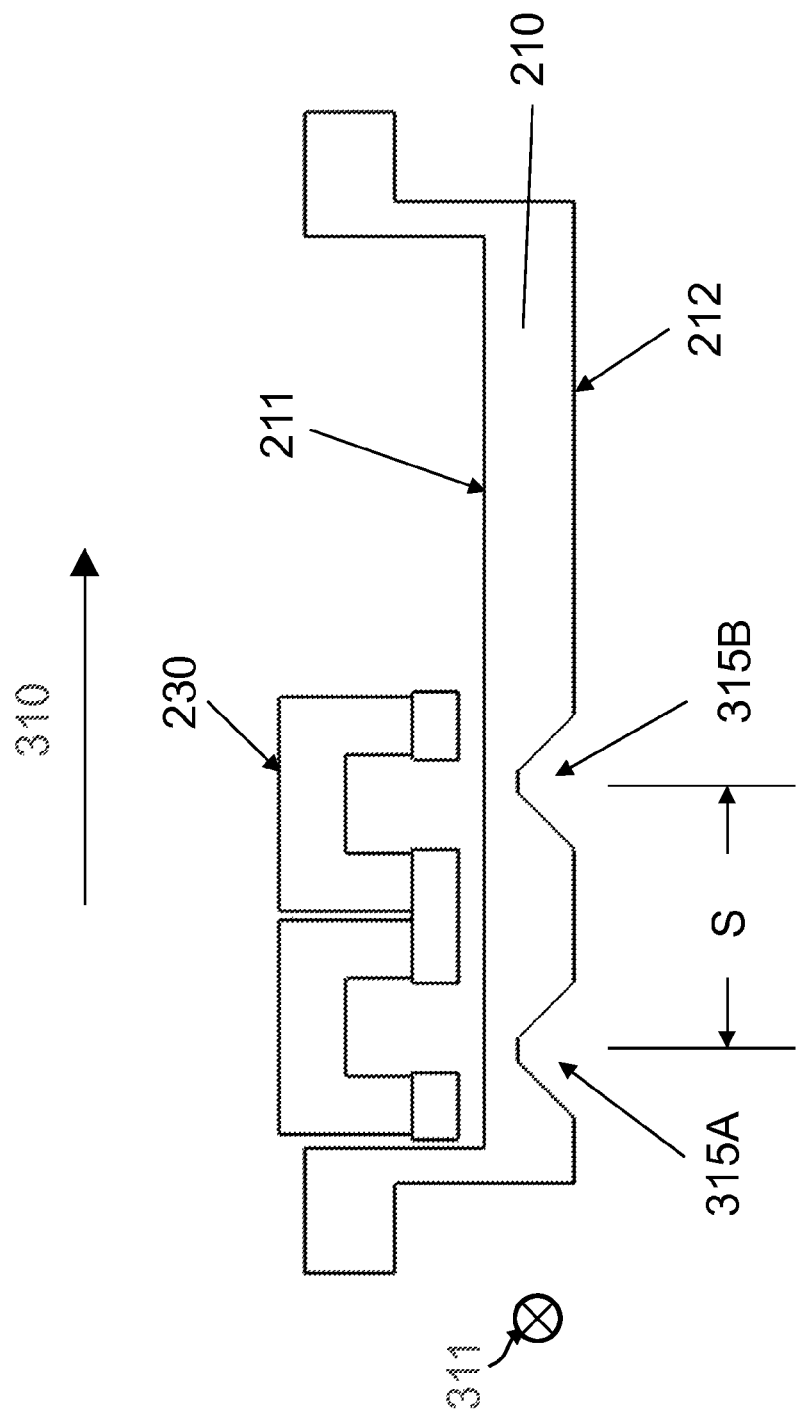
FIG. 3A is a cross-sectional view of an arrangement of a moveable magnetron and a target in the deposition system of FIG. 2A when the magnetron is at a first position.
Figure 3B:
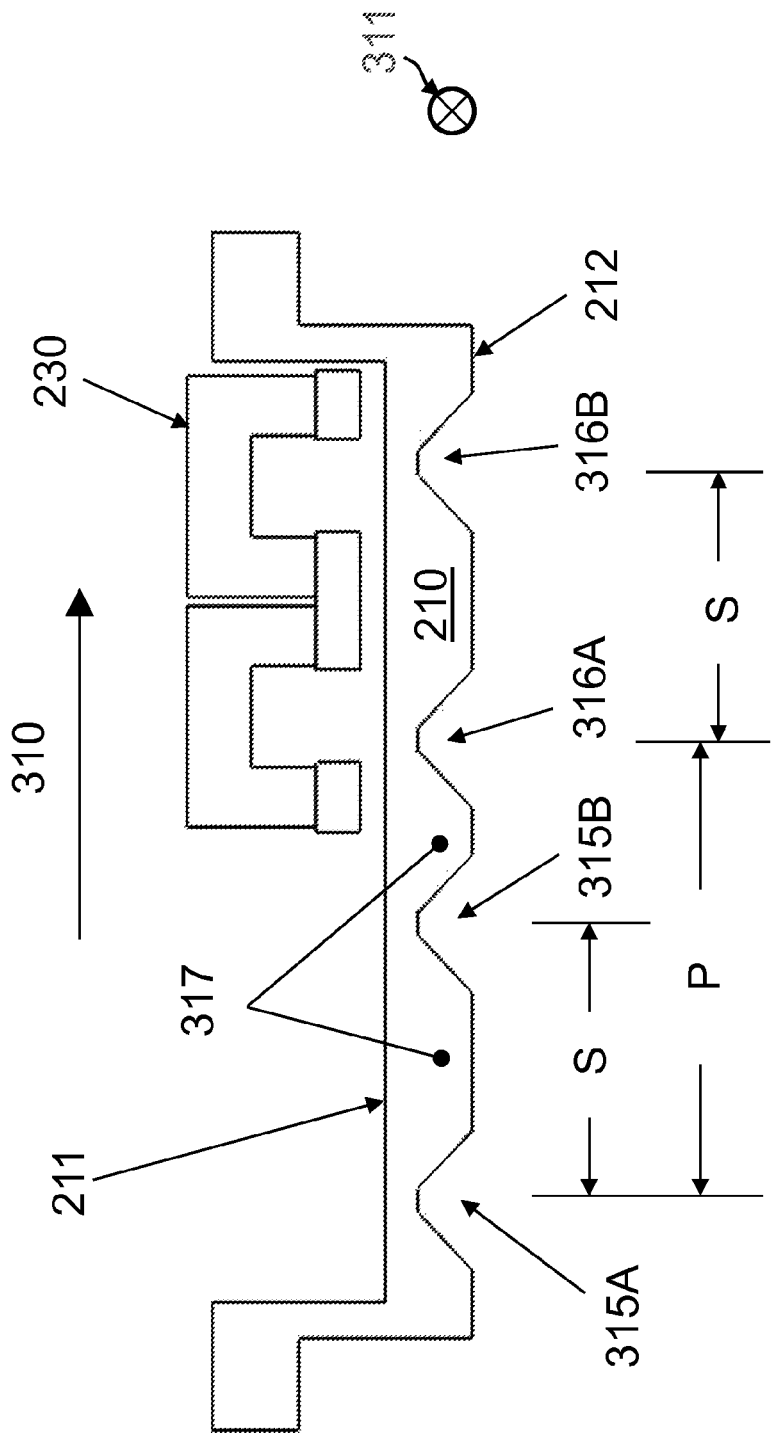
FIG. 3B is a cross-sectional view of the moveable magnetron and the target in the arrangement shown in FIG. 3A when the magnetron is at a second position.
Figure 3C:
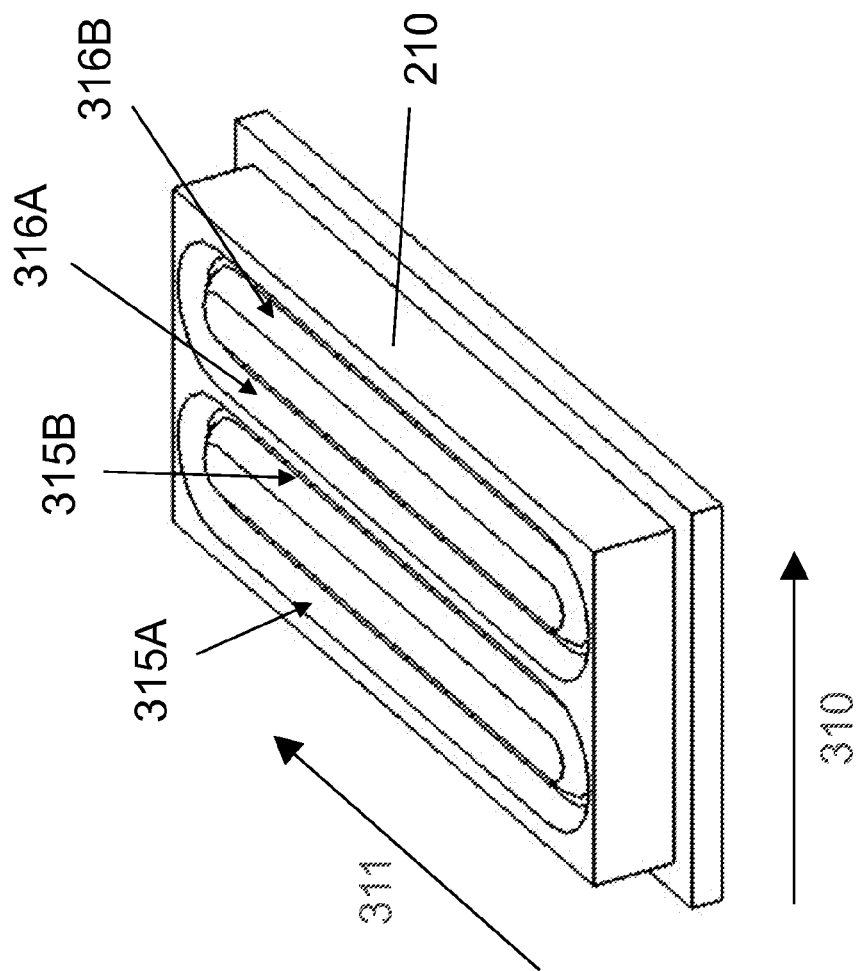
FIG. 3C is a perspective view showing an erosion pattern on the target after a period of deposition in the configuration shown in FIGS. 3A and 3B.

The magnetron 230 needs to be properly designed to increase target material usage and to reduce material waste. An example of undesirable target usage is shown in FIGS. 3A-3C (components other than the target and the magnetron are not shown for clarity reason). The magnetron 230 is shown to be positioned at the left end of the target 210 in FIGS. 3A-3C. Erosion grooves 315A and 315B appear along a direction 311 in the sputtering surface 212 after a period of sputtering deposition. The distance between the erosion grooves 315A and 315B is "S", approximately the distance between the gaps 238A and 238C between the magnetic poles 232 and 235 in the magnetron 230. The magnetron 230 can be moved by the transport mechanism 260 (shown in FIG. 2A) along a direction 310 to the right end of the target 210 (FIG. 3B). In some configuration, the direction 310 is substantially perpendicular to the direction of the erosion grooves 315A, 315B, 316A, and 316B. If the displacement "P" of the magnetron 230 is bigger than "S", another set of erosion grooves 316A and 316B appear in the sputtering surface 212 after a period of deposition with the magnetron 230 at this second position (as shown in FIGS. 3B and 3C). The erosion grooves 316A and 316B are also separated by a distance "S". The target 210 needs to be replaced before the troughs of the grooves 315A-316B reach the back surface 211 of the target 210. Unused target portions 317 will be discarded, which results in low target utilization typically below 30%.

Figure 4A:
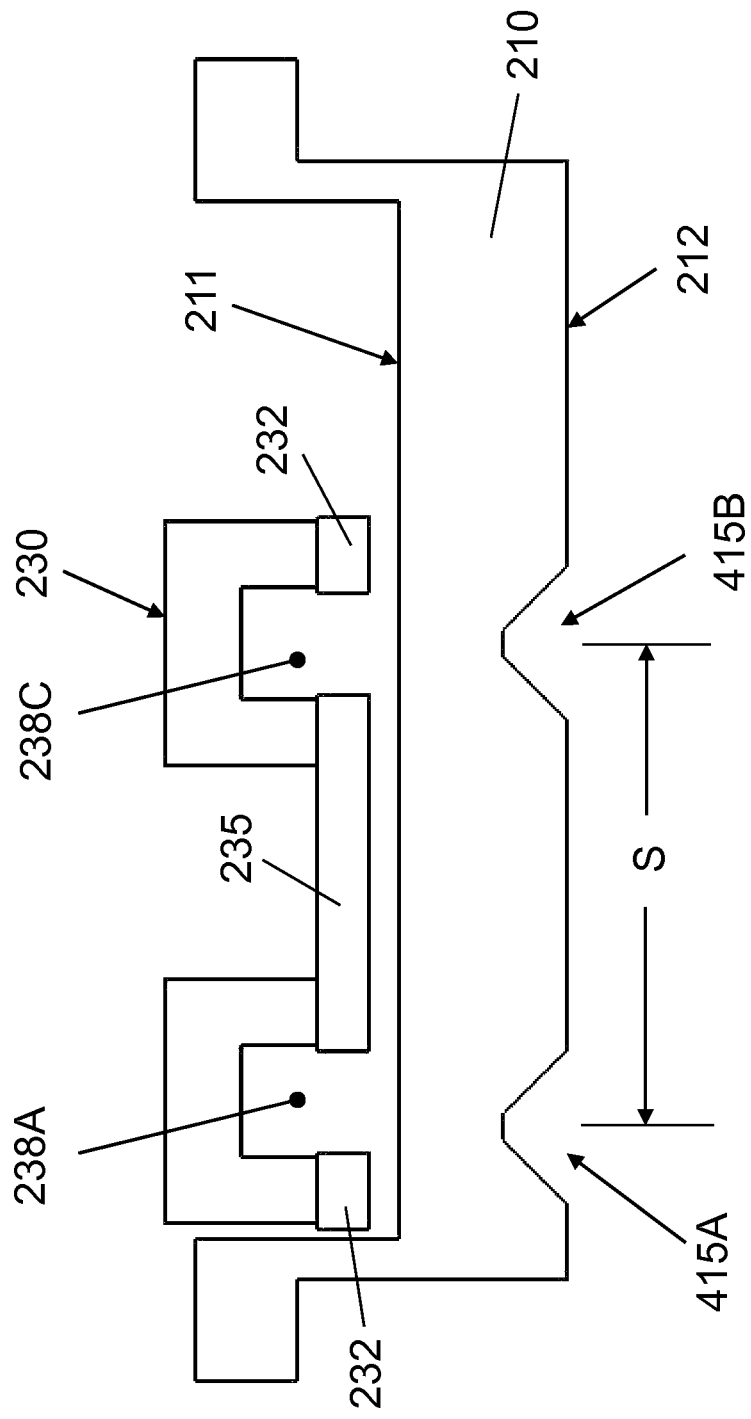
FIGS. 4A-4C are cross-sectional views showing an improved arrangement of a moveable magnetron and a target in the deposition system of FIG. 2A when the moveable magnetron is at different positions.
Figure 4B:
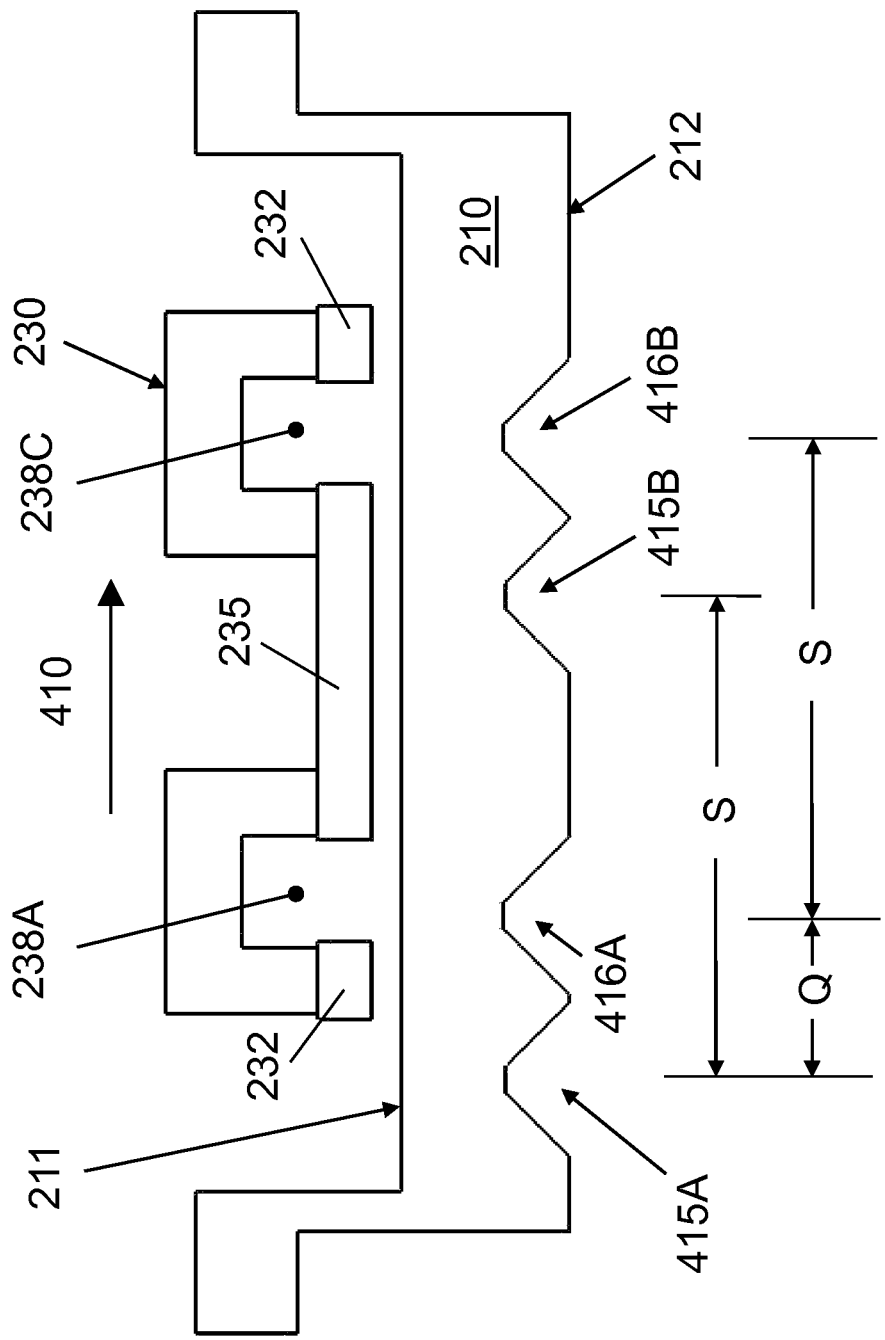
Figure 4C:
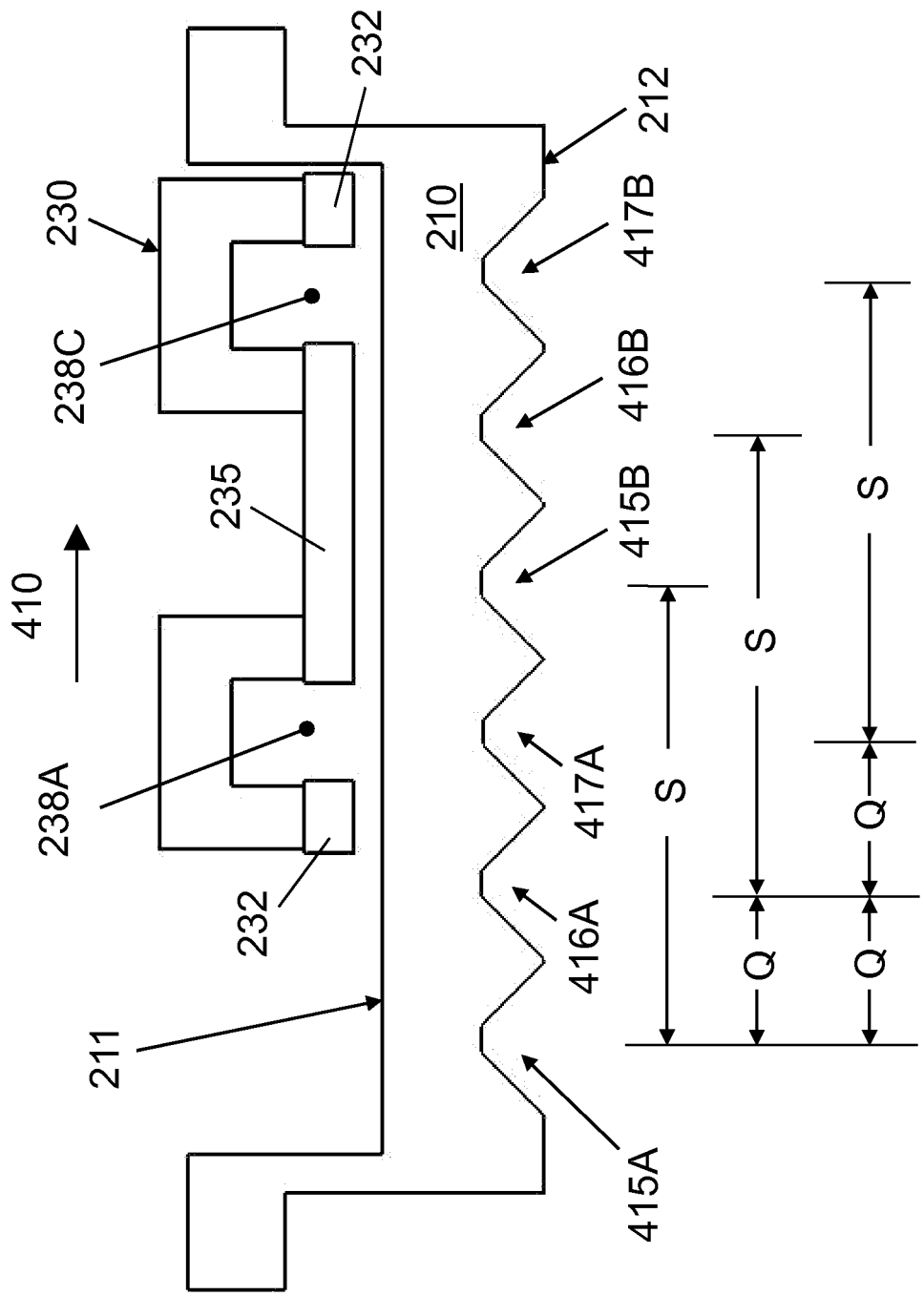

The dimensions of the magnetron 230 and the target 210 as well as the operation of the magnetron 230 can be designed to maximize target material usage and to reduce material waste. Referring to FIGS. 4A-4C (components other than the target and the magnetron are not shown for viewing clarity), the magnetron 230 is first positioned at the left end of the target 210 in FIG. 4A to produce erosion grooves 415A and 415B after a period of sputtering deposition. The distance between the erosion grooves 415A and 415B is "S", the distance between the gaps 238A and 238C between the magnetic poles 232 and 235 in the magnetron 230. The magnetron 230 is moved by the transport mechanism 260 (shown in FIG. 2A) along a direction 410 by a step (FIG. 4B). The step size "Q" is smaller than "S". Sputtering and deposition at this step produces another set of erosion grooves 416A and 416B. The direction 410 can be substantially perpendicular to the erosion grooves 415A and 415B (and erosion grooves 416A-417B as discussed below).

Figure 4D:
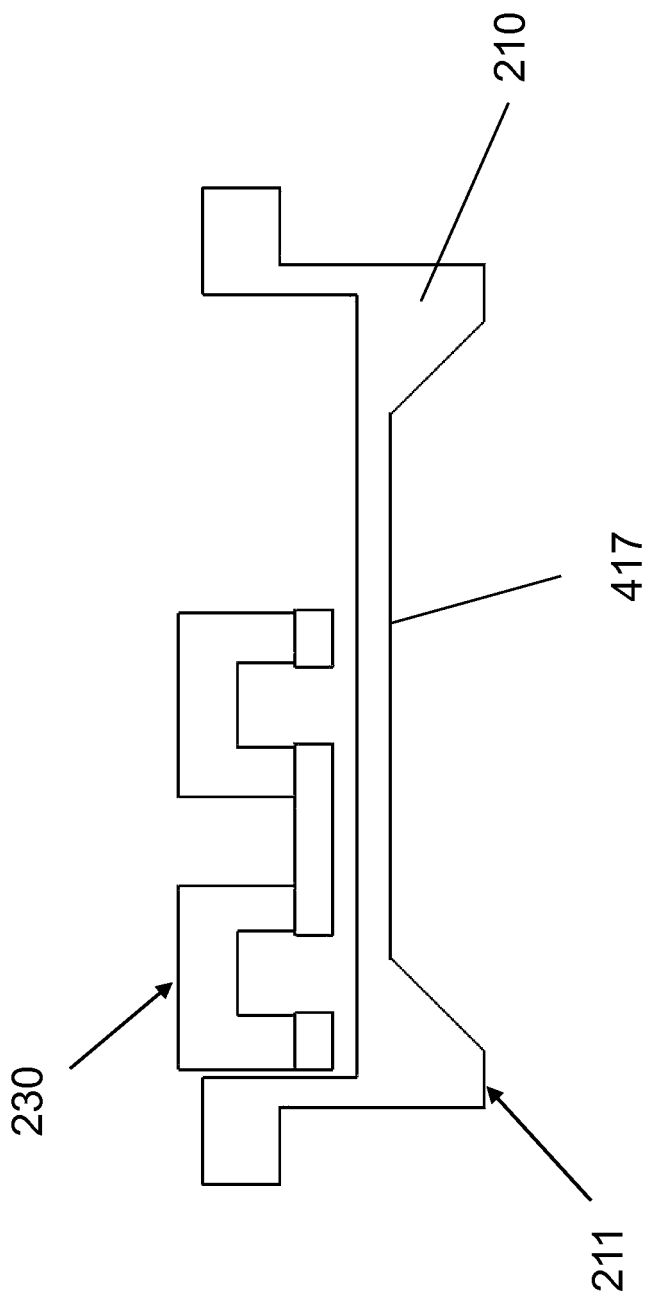
FIG. 4D is a cross-sectional view showing the erosion pattern on the target after a period of deposition in the configuration shown in FIGS. 4A-4C.

The magnetron 230 is moved along a direction 410 by another step with the same step size "Q" (FIG. 4C). Sputtering and deposition at this step produces another set of erosion grooves 417A and 417B. The magnetron 230 is moved (shown in FIGS. 4A-4C) from the left end to the right end of the target 210 in two steps. It should be noted that FIGS. 4A-4C are intended to illustrate an example of the invention concept. A magnetron can move from one end to the other end of the target in one or more steps. The erosion grooves 415A and 415B, 416A and 416B, 417A and 417B are staggered with each other and even distributed across the sputtering surface 212. The movement and deposition steps shown in FIGS. 4A-4C can be repeated in smaller steps so that the erosion groves overlap and can form a smooth surface. As a result, as shown in FIG. 4D, a smoother eroded surface 417 is formed on the sputtering surface 212 after the magnetron 230 moves back and forth the back of the target 210 multiple times. The deposition events can occur at each step when the magnetron travels along and reverse to the direction 410. A large number of steps can result in smoother eroded surface 417 and more even erosion in the target 210. Using such approach, more than 70% of target material can be used before a target needs to be replaced.

Figure 4E:
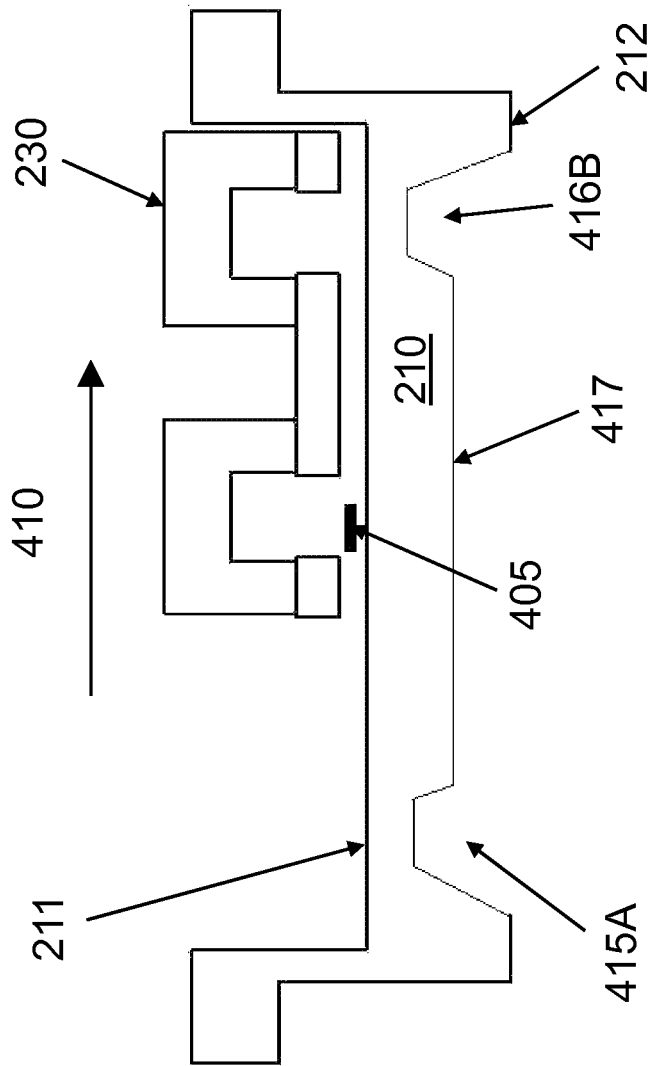
FIG. 4E is a cross-sectional view of another improved arrangement of a moveable magnetron and a target in the deposition system of FIG. 2A.

It is found that the erosion grooves (e.g. 415A and 417B) at the ends of the travel path are somewhat deeper, which is caused by the slower magnetron movement at the reverse motion at the ends of the travel path or intentional slowing down the magnetron speed at end of the travel to improve deposition uniformity by increasing the erosion near edge of the target. The slowing down of the magnetron also causes excess overlap of erosion groves near center of the target and reduces target utilization. In addition, the excess erosion near target center degrades deposition uniformity. It is therefore desirable to reduce the amount of deposition and erosion on the target surface caused by the slower magnetron movement at the two end positions of the target. In some embodiments, referring to FIG. 4E, a shunting device 405 is placed near the back surface 211 adjacent to the magnetic poles 232 and 235 when the magnetron 230 is positioned at the end of the travel path. The shunting devices 405 can be made of a permanent magnetic material such as 400 series stainless steel. The shunting devices 405 can interrupt and reduce the magnetic flux lines the magnetic poles 232 and 235 and thus reduce the plasma ionization efficiency and thus decrease the amount of deposition. The amount of erosion can thus be reduced at the end steps. The shunt can be placed at any location where excessive erosion is occurring.

Figure 5:
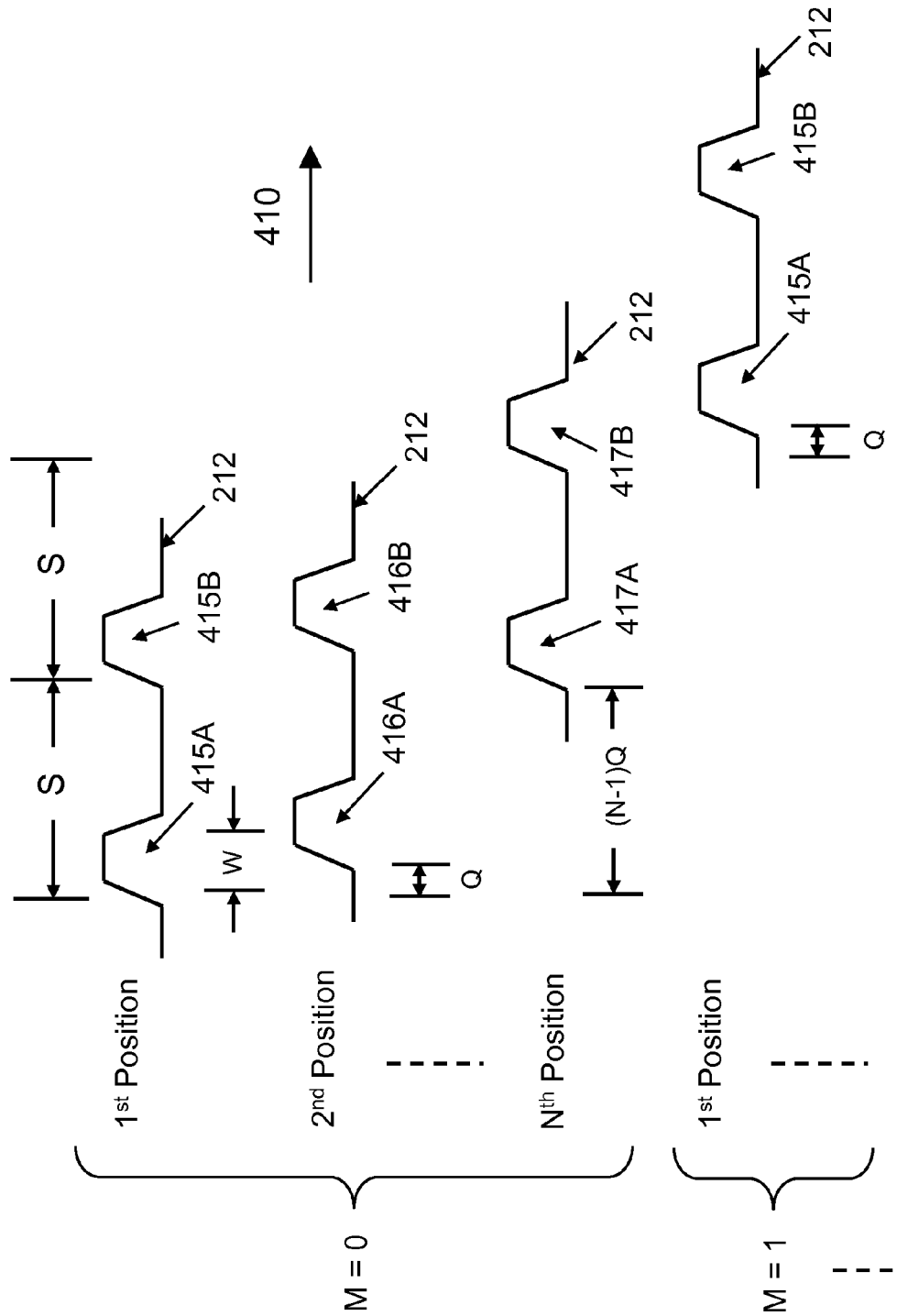
FIG. 5 illustrates the relationships among the dimensions of the magnetron and target, and the step width of the moveable magnetron.

FIG. 5 illustrates the geometric relationships among the magnetron, the target, and the movement of the moveable magnetron, and showing the erosion patterns on the sputtering surfaces 212 shown in FIGS. 4A-4C. Each erosion groove 415A-417B is characterized by a width "W". W can be the distance between the half full depths of the erosion grove. As described above, the distance between the erosion grooves at each fixed deposition position is "S". The step size for the magnetron's movement is "Q", which is substantially the same for the N steps.

$$S=NQ \qquad \text{Eqn. (1)}$$

in which N is an integer number and N≧2. For example, N can be 10, 20, or infinite (continuous). The magnetron stops at each step to allow the material is sputtered off the sputtering surface 212 and to be deposited on the substrate 215. For large N (e.g. >10), the relationship expressed in Equation (1) assures the adjacent erosion grooves 415A-417B to be densely packed on the sputtering surface 212.

In the first segment, the magnetron moves N−1 steps spanning a travel distance T1:

$$T1=(N-1)Q \qquad \text{Eqn. (2)}$$

The total travel distance is related to the clear distance that the magnetron 230 can move on the back surface of the target 210. In some embodiments, T1 is the total travel distance of the magnetron; the magnetron can be moved back to the starting position by a distance (N−1)Q in a single step. The magnetron can also be moved back to the original position in N−1 steps with material sputtering and deposition at each step.

In other cases, the total travel distance can be longer than T1. After a magnetron is moved to the Nth position in the first segment of travel distance T1, the magnetron can move in a second segment substantially faster (at least 2 or 3 times faster) than the movement in the first segment. The distance of travel is (N+1)Q in the second segment. The power for the magnetron can be turned off in the second segment to maintain uniform erosion across target, which stops material sputtering in the second segment, or keeps materials sputtering at a significant lower sputtering rate compared to the first segment.

The movement pattern (N−1 discrete steps) in the first segment is repeated in a third segment as shown in FIG. 5. Using equations (1) and (2), the total travel distance in the first three segments of travel is $$T1+T2+T3 = (N-1)Q+(N+1)Q+(N-1)Q \qquad \text{Eqn. (3)}$$
$$= 2S+(N-1)Q$$

The dimensions of the magnetron and the target can be designed to have any integer L segments of slow movements and continuous sputtering operations separated by L−1 segments fast movements. The total travel distance for the 2L−1 segments is $$T=2(L-1)S+(N-1)Q. \qquad \text{Eqn. (4)}$$

Wherein 2(L−1) is named M which is also an integer.

In some embodiments, the magnetron can be continuously moved within each of L segments while sputtering is continuously conducted and only stopped or minimized during the large movement (in L−1 segment) between successive slow and sputtering segments. In this case, N is infinitely large and Q≈0. For the 2L−1 segments, the total travel distance is $$T≈2(L-1)S+NQ=(2L-1)S. \qquad \text{Eqn. (5)}$$

One particular case for Equation (5) is when there is only one segment of travel for the magnetron, or L=1, $$T1≈S. \qquad \text{Eqn. (6)}$$

The target material is continuously sputtered off the target during the first segment of travel. The sputtering stops when the movement ends at the travel distance S (≈T1).

In some embodiments, T1 is the total travel distance of the magnetron; the magnetron can be moved back to the starting position by a distance (N−1)Q in the second segment. The magnetron can also be moved back to the original position by continuously sputtering material off the target and depositing material on the substrate.

If there is a third segment of travel, the magnetron moves by a distance S at higher speed than during the first segment of travel with no sputtering. The continuous and slower scanning by the magnetron and the continuous sputtering of target material resumes in the third segment of travel from travel distance 2S to 3S. The subsequent segments of travel can be repeated by alternating magnetron movements: a fast travel by a distance S without sputtering, and a slow continuous travel and continuous sputtering also by a distance S.

In accordance to the present invention, the smoothness of the sputtering surface 212 can be optimized with the following relationships:

$$Q \approx W \qquad \text{Eqn. (7)}$$

that is, the step size "Q" is selected to be approximately the characteristic "W", or within +/−10% of "W", that is, in a range of about 0.9 W and about 1.1 W. In this case, we have:

$$S \approx NW \qquad \text{Eqn. (8)}$$

Equation (8) shows that the separation between the long gaps 238A and 238C in the magnetron is desirably approximately an integer multiple of the characteristic width "W" in an erosion groove. Alternatively, S is in a range within 0.1 W of NW. Moreover, the magnetron is desirably moved by the integer multiple (i.e. S/W) steps to achieve even erosion and reduce target material waste. Equation (8) thus sets forth a constraint between the dimensions of the target and the magnetron, and the selection of the step size for the magnetron. Under the conditions expressed in Equations (4), (7) and (8), for the L number of stepped sputtering segments separated by L−1 fast moving segments, the total travel distance is $$T \approx 2(L-1)S + (N-1)W = 2LS - (S+W). \qquad \text{Eqn. (9)}$$

Figure 6:
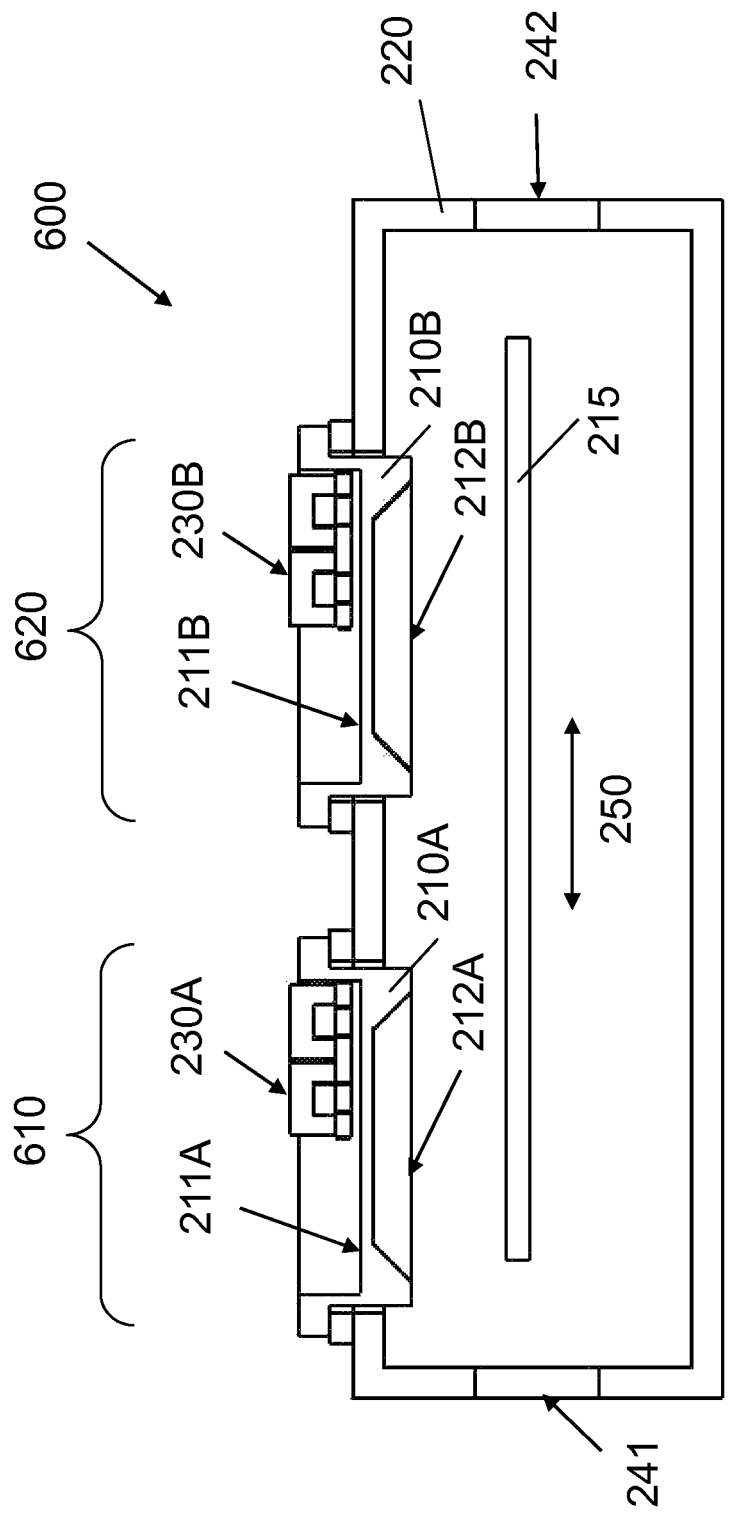
FIG. 6 is a cross-sectional view of another improved deposition system comprising two deposition sources in a deposition chamber.

The described systems and methods are compatible with other configurations. Referring to FIG. 6, a deposition system includes a processing chamber 220 and two deposition sources 610 and 620 that respectively include a magnetron 230A or 230B, and a target 210A or 210B. The targets 210A and 210B respectively include sputtering surfaces 212A and 212B, and back surfaces 211A and 211B. The usage of the targets 210A and 210B can be maximized using the approaches as described above.

Figure 7A:
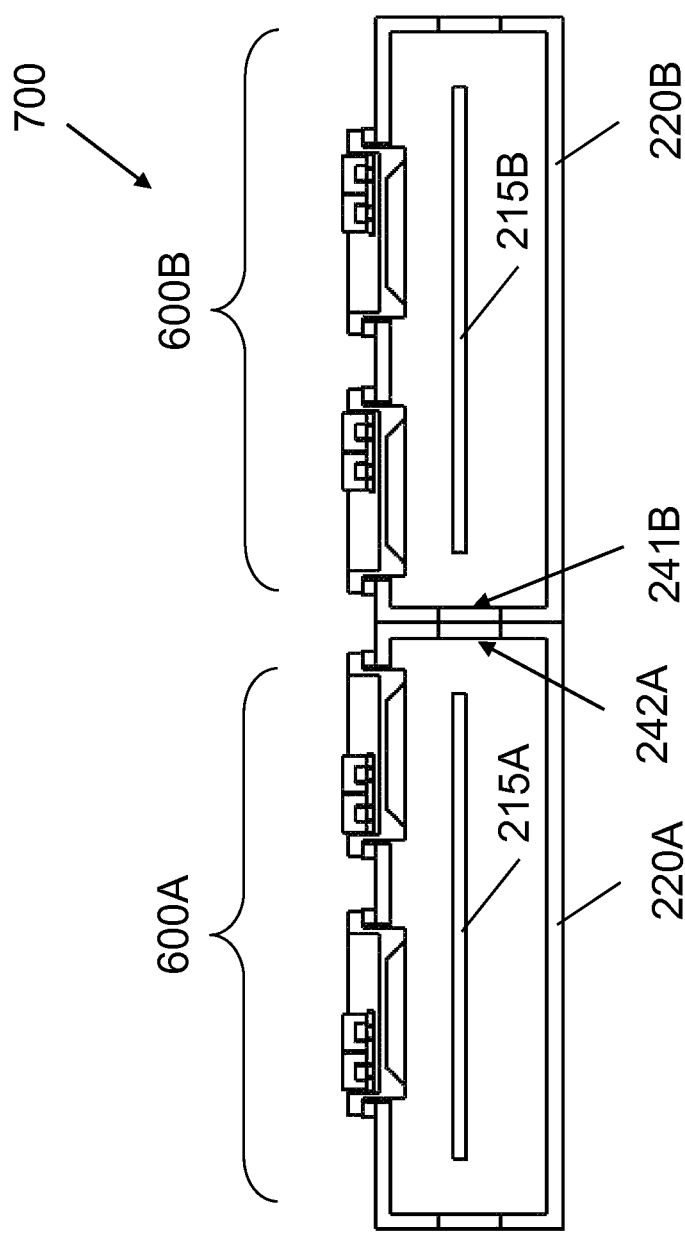
FIG. 7A is a cross-sectional view of another improved deposition system comprising two deposition chambers each comprising two deposition sources each including a moveable magnetron or a stepping magnetron.
Figure 7B:
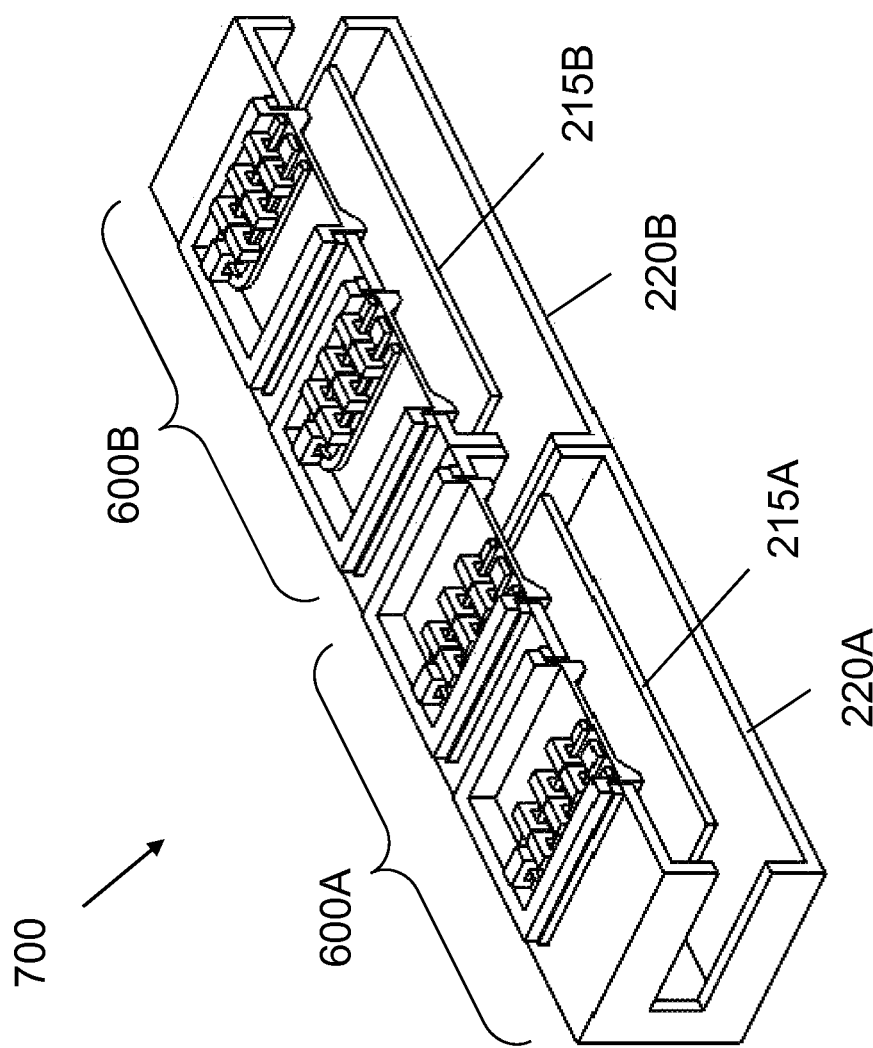
FIG. 7B is a cross-sectional perspective view of the deposition system of FIG. 7A.
Figure 7C:
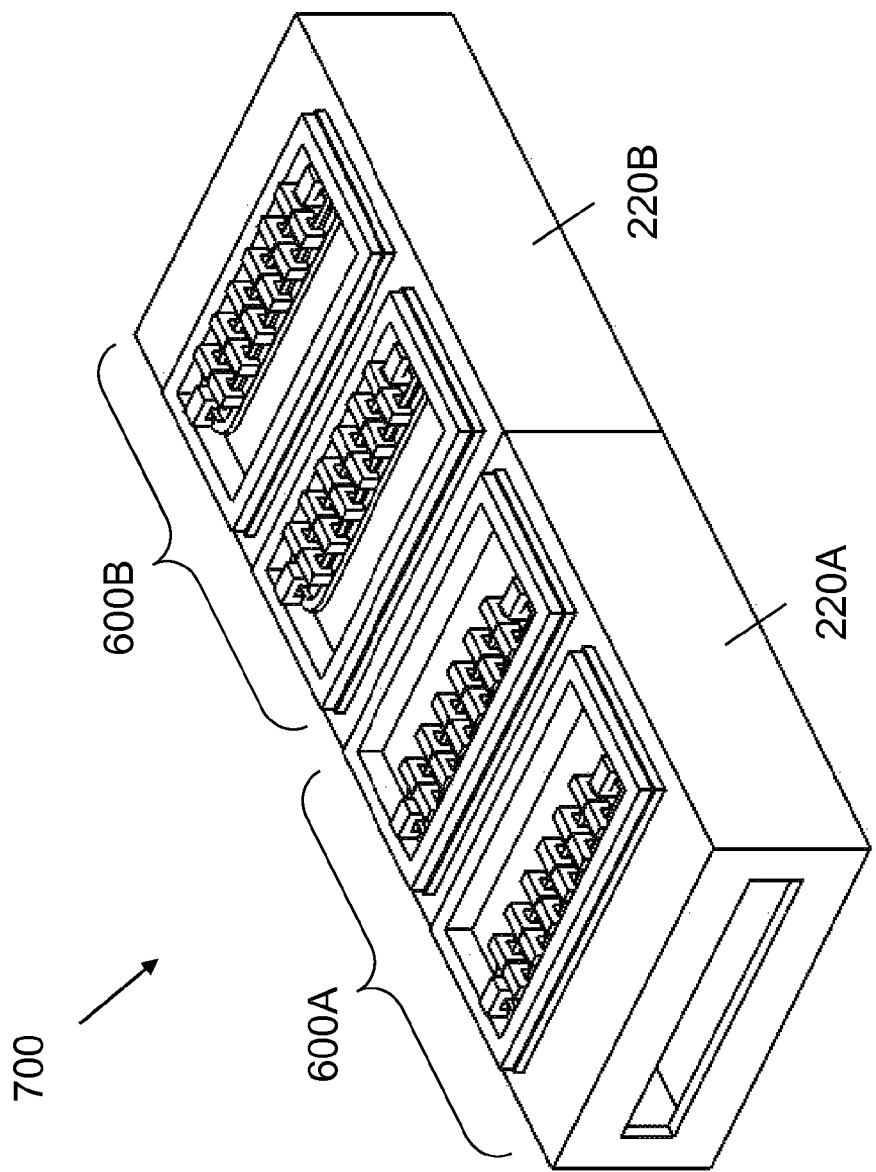
FIG. 7C is a perspective view of the deposition system of FIG. 7A.

In some embodiments, referring to FIGS. 7A-7C, a deposition system 700 includes two interconnected deposition systems 600A and 600B respectively including processing chambers 220A and 220B. The processing chamber 220A includes an opening 242A that is registered to an opening 241B in the processing chamber 220B. A gate can be opened of closed to allow a substrate 215A or 215B to move between the processing chambers 220A and 220B.

It is understood that the disclosed systems and methods are compatible with other configurations without deviating from the spirit of the present invention. The disclosed processing chamber is compatible with many different types of processing operations such as physical vapor deposition (PVD), thermal evaporation, thermal sublimation, sputtering, chemical vapor deposition (CVD), plasma enhanced chemical vapor deposition (PECVD), ion etching, or sputter etching. The targets, the magnetrons, and the substrate can be positioned in relative positions other than the examples described above. The transport mechanisms for the magnetron and the substrate can take many different forms. The direction of the travel for the magnetron can be alternated in opposite directions, and repeat many times to sputter materials for deposition.

Examples of target materials compatible with the described systems and methods include aluminum (Al), aluminum zinc (AlZn), aluminum zinc oxide (AlZnO), aluminum oxide (Al2O3), aluminum nitride (AlN), aluminum copper (AlCu), aluminum silicon (AlSi), aluminum silicon copper (AlCuSi), aluminum fluoride (AlF), antimony (Sb), antimony telluride (SbTe), barium (Ba), barium titanate (BaTiO), barium fluoride (BaF), barium oxide (BaO), barium strontium titanate (BaSrTiO), barium calcium cuprate (BaCaCuO), bismuth (Bi), bismuth oxide (BiO), bismuth selenide (BiSe), bismuth telluride (BiTe), bismuth titanate (BiTiO), boron (B), boron nitride (BN), boron carbide (BC), cadmium (Cd), cadmium chloride (CdCl), cadmium selenide (CdSe), cadmium sulfide (CdS), CdSO, cadmium telluride (CdTe), CdTeHg, CdTeMn, cadmium stannate (CdSnO), carbon (C), cerium (Ce), cerium fluoride (CeF), cerium oxide (CeO), chromium (Cr), chromium oxide (CrO), chromium silicide (CrSi), cobalt (Co), copper (Cu), copper oxide (CuO), copper gallium (CuGa), CuIn, CuInSe, CuInS, CuInGa, CuInGaSe (CIGS), CuInGaS, Dy, Er, ErBaCuO, Eu, Gd, Ge, GeSi, Au, Hf, HfC, HfN, Ho, In, InO, InSnO (ITO), Ir, Fe, FeO, La, LaAlO, LaNiO, LaB, LaO, Pb, PbO, ObTe, PbTiO3, PbZrO, PbZrTiO (PZT), LiNbO, Mg, MgF, MgO, Mn, MnO, Mo, MoC, MoSi. MoO, MoSe, MoS, Nd, NdGaO, Ni, NiCr, NiFe, NiO, NiV, Nb, NbC, NbN, NbO, NeSe, NbSi, NbSn, Pd, NiFeMoMn (permalloy), Pt, Pr, PrCaMnO (PCMO), Re, Rh, Ru, Sm, SmO, Se, Si, SiO, SiN, SiC, SiGe, Ag, Sr, SrO, SrTiO (STO), Ta, TaO, TaN, TaC, TaSe, TaSi, Te, Tb, Tl, Tm, Sn, SnO, SnOF (SnO: F), Ti, TiB, TiC, TiO, TiSi, TiN, TiON, W, WC, WO, WSi, WS, W—Ti, V, VC, VO, Yb, YbO, Y, YbaCuO, YO, Zn, ZnO, ZnAlO (ZAO), ZnAl, ZnSn, ZnSnO, ZnSe, ZnS, ZnTe, Zr, ZrC, ZrN, ZrO, ZrYO (YSZ), and other solid element or compound.

What is claimed is:

1. A method for substrate processing, comprising:
   in a processing chamber, producing a magnetic field by a magnetron across a full width of a sputtering surface of a target in a first direction, wherein the magnetron is configured to produce two erosion grooves separated by a distance S on the sputtering surface, wherein each of the erosion grooves is characterized by a width W;
   moving the magnetron at a first speed by a distance T1 in (N−1) steps in a first segment along a linear travel path, wherein T1=(N−1)Q is a total travel distance in the first segment in which Q is step size and N is an integer number and N≧2, wherein Q is between 0.9 W and 1.1 W, wherein the magnetron is stopped at each of the N−1 steps, wherein the linear travel path is substantially parallel to a second direction that is perpendicular to the first direction;
   sputtering a material off the sputtering surface and depositing the material on the substrate during the first segment;
   moving the magnetron by the distance S in a second segment along the linear travel path at a second speed higher than the first speed; and
   turning off power of the magnetron to reduce sputtering rate when the magnetron is moved in the second segment.

2. The method of claim 1, further comprising:
   moving the magnetron by the distance S in a third segment along the linear travel path;
   continuously sputtering the material off the sputtering surface; and
   depositing the material on the substrate during the third segment.

3. The method of claim 1, wherein the magnetron is moved at the second speed by the distance S opposite to the second direction in the second segment.

4. The method of claim 1, further comprising:
producing a bias voltage between the target and the processing chamber to enable the material to be sputtered off the sputtering surface.

5. The method of claim 4, wherein the magnetron is positioned adjacent to a back surface of the target opposite to the sputtering surface.

6. A method for substrate processing, comprising:
in a processing chamber, producing a magnetic field by a magnetron across a full width of a sputtering surface of a target in a first direction, wherein the magnetron is configured to produce two erosion grooves separated by a distance S on the sputtering surface, wherein each of the erosion grooves is characterized by a width W;

moving the magnetron by a distance T1 in (N−1) steps in a first segment along a linear travel path substantially parallel to a second direction that is perpendicular to the first direction, wherein T1=(N−1)Q is a total travel distance in the first segment in which Q is step size and N is an integer number and N≧2, wherein Q is between 0.9 W and 1.1 W, wherein the magnetron is stopped at each of the N−1 steps;

sputtering a material off the sputtering surface and depositing the material on the substrate during the first segment;

moving the magnetron by the distance T1 in a second segment substantially parallel to the linear travel path and opposite to the second direction; and sputtering a material off the sputtering surface and depositing the material on the substrate during the second segment.

7. The method of claim 6, further comprising:
producing a bias voltage in the first segment and the second segment between the target and the processing chamber to enable the material to be sputtered off the sputtering surface.

8. The method of claim 6, wherein the magnetron is positioned adjacent to a back surface of the target opposite to the sputtering surface.

\* \* \* \* \*